(12) United States Patent
Lee

(10) Patent No.: US 12,302,532 B2
(45) Date of Patent: May 13, 2025

(54) HOUSING FOR REPEATER

(71) Applicant: AMOGREENTECH CO., LTD., Gimpo-si (KR)

(72) Inventor: Jin Hyoung Lee, Gimpo-si (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 610 days.

(21) Appl. No.: 17/613,306

(22) PCT Filed: May 25, 2020

(86) PCT No.: PCT/KR2020/006756
§ 371 (c)(1),
(2) Date: Nov. 22, 2021

(87) PCT Pub. No.: WO2020/235978
PCT Pub. Date: Nov. 26, 2020

(65) Prior Publication Data
US 2022/0232727 A1    Jul. 21, 2022

(30) Foreign Application Priority Data
May 23, 2019   (KR) .................... 10-2019-0060684

(51) Int. Cl.
*H05K 7/20*   (2006.01)
*C08K 3/38*   (2006.01)
(Continued)

(52) U.S. Cl.
CPC ............. *H05K 7/2039* (2013.01); *C08K 3/38* (2013.01); *C08K 7/00* (2013.01); *C08K 9/02* (2013.01);
(Continued)

(58) Field of Classification Search
CPC ... C08K 3/38; C08K 7/00; C08K 9/02; C08K 5/14
(Continued)

(56) References Cited

U.S. PATENT DOCUMENTS

2014/0018469 A1   1/2014  Korzhenko et al.
2019/0291364 A1*  9/2019  O'Connor ............... B29C 70/58

FOREIGN PATENT DOCUMENTS

JP   2010229200 A   10/2010
JP   2011225882 A   11/2011
(Continued)

OTHER PUBLICATIONS

Machine translation of KR1020130036573 (Year: 2013).*
(Continued)

*Primary Examiner* — Vincent Tatesure
(74) *Attorney, Agent, or Firm* — ROTHWELL, FIGG, ERNST & MANBECK, P.C.

(57) ABSTRACT

A housing for repeater having an accommodation part accommodating therein a device for repeating an RF signal, and at least a portion of the housing is implemented with heat dissipation plastic having, at a frequency of 28 GHz, a relative permittivity of less than or equal to 4 and a thermal conductivity of greater than or equal to 3 W/mK. Accordingly, as the housing has a high heat dissipation performance against high heat generated from various types of devices provided inside the repeater for transmitting and receiving a signal in a high frequency band and minimizes the interference of transmission and reception of the signal in the high frequency band, the housing can be widely used as a housing for repeater in the mobile communication field or the like using a signal in a high frequency band.

12 Claims, 13 Drawing Sheets

(51) Int. Cl.
 *C08K 7/00* (2006.01)
 *C08K 9/02* (2006.01)
 *C09K 5/14* (2006.01)
 *H04B 7/155* (2006.01)

(52) U.S. Cl.
 CPC .......... *C09K 5/14* (2013.01); *C08K 2003/385* (2013.01); *C08K 2201/001* (2013.01); *C08K 2201/005* (2013.01); *H04B 7/155* (2013.01)

(58) Field of Classification Search
 USPC ....................................................... 428/36.4
 See application file for complete search history.

(56) References Cited

FOREIGN PATENT DOCUMENTS

| JP | 2016088838 A | | 5/2016 | |
| KR | 20060041325 A | | 5/2006 | |
| KR | 20130036573 A | * | 4/2013 | |
| KR | 20170046033 A | | 4/2017 | |
| WO | WO-2018111031 A1 | * | 6/2018 | ............. B60R 16/02 |

OTHER PUBLICATIONS

Machine translation of WO-2018111031A1 (Year: 2018).*
"Very high thermal conductivity obtained by boron nitride-filed polybenzoxazine," Ishida et al., Thermochimica Acta, vol. 320, pp. 177-186, 1998 (Year: 1998).*
International Search Report and Written Opinion issued in PCT/KR2020/006756 dated Sep. 4, 2020, 10 pages.
Hirahara, T., Designable core-shell graphite particles for thermally conductive and electrically insulating polymer composites, RSC Adv., 2018, 8(30), 16781-16787.

* cited by examiner

X - X'

HOUSING FOR REPEATER

CROSS-REFERENCE TO RELATED APPLICATIONS

This application is the national phase entry of International Application No. PCT/KR2020/006756, filed on May 25, 2020, which is based upon and claims priority to and the benefit of Korean Patent Application No. 10-2019-0060684, filed on May 23, 2019, the entire contents of which are incorporated herein by reference.

TECHNICAL FIELD

The present invention relates to a housing for a repeater, and more particularly, to a housing for repeater for transmitting and receiving a signal in a high frequency band.

BACKGROUND

A repeater is a device that receives a weakened signal in the middle of the communication system, amplifies and retransmits it, or shapes the waveform of a distorted signal and adjusts or reconstructs the timing for transmission. In the beginning, such a repeater was simply for the purpose of retransmitting a signal, but recently, it plays a role of a low-cost base station in consideration of service coverage that saves equipment and operating costs.

One of the fields where repeaters are widely used is in the mobile communication field, and the importance of the repeater for mobile communication is increasing day by day as it can provide high-quality services without the installation of additional base stations in mountainous areas where mobile communication services cannot reach, underground spaces (radio wave blind spots) where the radio wave environment is poor among urban areas, and apartment complexes and the like. In addition, as the demand for high-quality service increases, the number of installations thereof also tends to increase significantly.

The signal transmitted and received through the mobile communication repeater is radio waves. 5G, which is currently under construction ahead of commercialization, uses high frequency bands of 3.5 GHz and 28 GHz, and since it uses a significantly higher high frequency band compared to 4G, and it has communication characteristics such as lower diffraction (strong straightness) and shorter radio wave reach than 4G, there is a need to install more base stations or repeaters than 4G.

Meanwhile, as the heat of communication devices and repeaters using high frequency bands such as 5G also increases significantly compared to devices using low frequency bands, research on housings capable of dissipating the heat of communication devices provided in the repeaters is continuing.

The conventional repeater has been using methods such that it has a heating member, such as a heat sink, inside to relieve heat from the communication device provided in the repeater, or places the communication device in contact with the housing and implements the housing with a metal material with good heating characteristics, but in the case of 5G, as radio waves of a high frequency band with very strong straightness are used, conductive objects such as metals located on the path through which radio waves are transmitted and received block the transmission and reception of radio waves, thereby significantly reducing transmission and reception efficiency, and due to this, there is a problem in that it is difficult to use a metal material having excellent heating characteristics and mechanical strength as a housing.

In addition, when the housing is made of a plastic material in order not to interfere with radio waves in the high frequency band, there is a problem in that heat generated inside the housing cannot be easily conducted and radiated to the outside.

Accordingly, there is an urgent need to develop a heat dissipation housing that can protect wireless communication devices using a high frequency band such as 5G while having excellent heat dissipation characteristics and at the same time minimizing or preventing interference with signal in the high frequency band.

The above information disclosed in this Background section is only for enhancement of understanding of the background of the invention and it may therefore contain information that does not form the prior art that is already known to a person of ordinary skill in the art.

SUMMARY

The present invention has been devised in consideration of the above points, and is directed to providing a housing for repeater that has a high heat dissipation performance against high heat generated from various types of devices provided inside the repeater for transmitting and receiving a signal in a high frequency band and minimizes the interference of transmission and reception of the signal in the high frequency band.

Technical Solution

An exemplary embodiment of the present invention provides a housing for repeater having an accommodation part accommodating therein a device for repeating an RF signal, wherein at least a portion of the housing includes a heat dissipation plastic having, at a frequency of 28 GHz, a relative permittivity of less than or equal to 4 and a thermal conductivity of greater than or equal to 3 W/mK.

According to an exemplary embodiment of the present invention, one side of the housing is open, and the heat dissipation plastic may form at least a portion of a cover member for opening and closing one side of the housing.

In addition, the heat dissipation plastic may include a matrix and a heat dissipation filler dispersed in the matrix.

In addition, the heat dissipation plastic may have a thickness of 0.5 to 10 mm.

In addition, the heat dissipation filler may have a resistance of $1 \times 10^{14} \Omega$ or more.

In addition, the heat dissipation filler may have a plate-like shape.

In addition, the heat dissipation filler may have an average particle size of 1 to 50 μm, and may be provided in 50% by weight or more based on the total weight of the heat dissipation plastic.

In addition, the heat dissipation filler may include a first heat dissipation filler having a particle size of 0.2 to 0.8 μm, a second heat dissipation filler having a particle size of 3 to 7 μm, and a third heat dissipation filler having a particle size of 25 to 50 μm, in a weight ratio of 1:1.7 to 3.0:9.0 to 11.0.

In addition, the heat dissipation filler may be surface-modified with one or more functional groups selected from the group consisting of a hydroxyl group, an alkyl group, an amine group and an aniline group.

In addition, the matrix may include one or more selected from the group consisting of polyphenyl ether (PPE), polyphenyl ether/polystyrene alloy, polyphenyl ether/polypropylene alloy, polyphenyl ether/polyamide alloy, and liquid crystal polymer (LCP).

In addition, the heat dissipation filler may include one or more of aluminum nitride, boron nitride, silicon nitride, and silicon carbide.

In addition, the heat dissipation filler may include a heat dissipation filler having a structure including a thermally conductive core part and an insulating film covering the core part. In this case, the thermally conductive core part may be a carbon-based filler, and the insulating film may be silicon oxide.

In addition, the present invention provides a repeater including: a housing for repeater according to the present invention and a repeating part for repeating an RF signal, the repeating part being accommodated in the housing for repeater.

Advantageous Effects

As the housing for repeater according to the present invention has a high heat dissipation performance against high heat generated from various types of devices provided inside the repeater for transmitting and receiving a signal in a high frequency band and minimizes the interference of transmission and reception of the signal in the high frequency band, the housing can be widely used as a housing for repeater in the mobile communication field or the like using a signal in a high frequency band.

BRIEF DESCRIPTION OF THE DRAWINGS

The above and other aspects, features, and advantages of the present invention will become more apparent to those of ordinary skill in the art by describing embodiments thereof in detail with reference to the accompanying drawings, in which:

FIGS. 5A to 5C are graphs of the result of evaluating the influence of heat dissipation plastic on the standing wave ratio (VSWR) of an antenna for 5G, in which FIG. 5A is an antenna radiation pattern in a state without a heat dissipation plastic, FIG. 5B is an antenna radiation pattern in a state provided with a heat dissipation plastic according to Embodiment 1, and FIG. 5C is an antenna radiation pattern in a state provided with a heat dissipation plastic according to Comparative Example 3;

FIGS. 6A to 6C are graphs of the result of evaluating the influence of heat dissipation plastic on the radiation patterns of an antenna for 5G, in which FIG. 6A is an antenna radiation pattern in a state without a heat dissipation plastic, FIG. 6B is an antenna radiation pattern in a state provided with a heat dissipation plastic according to Embodiment 1, and FIG. 6C is an antenna radiation pattern in a state provided with a heat dissipation plastic according to Comparative Example 3.

DETAILED DESCRIPTION

Figure 1:
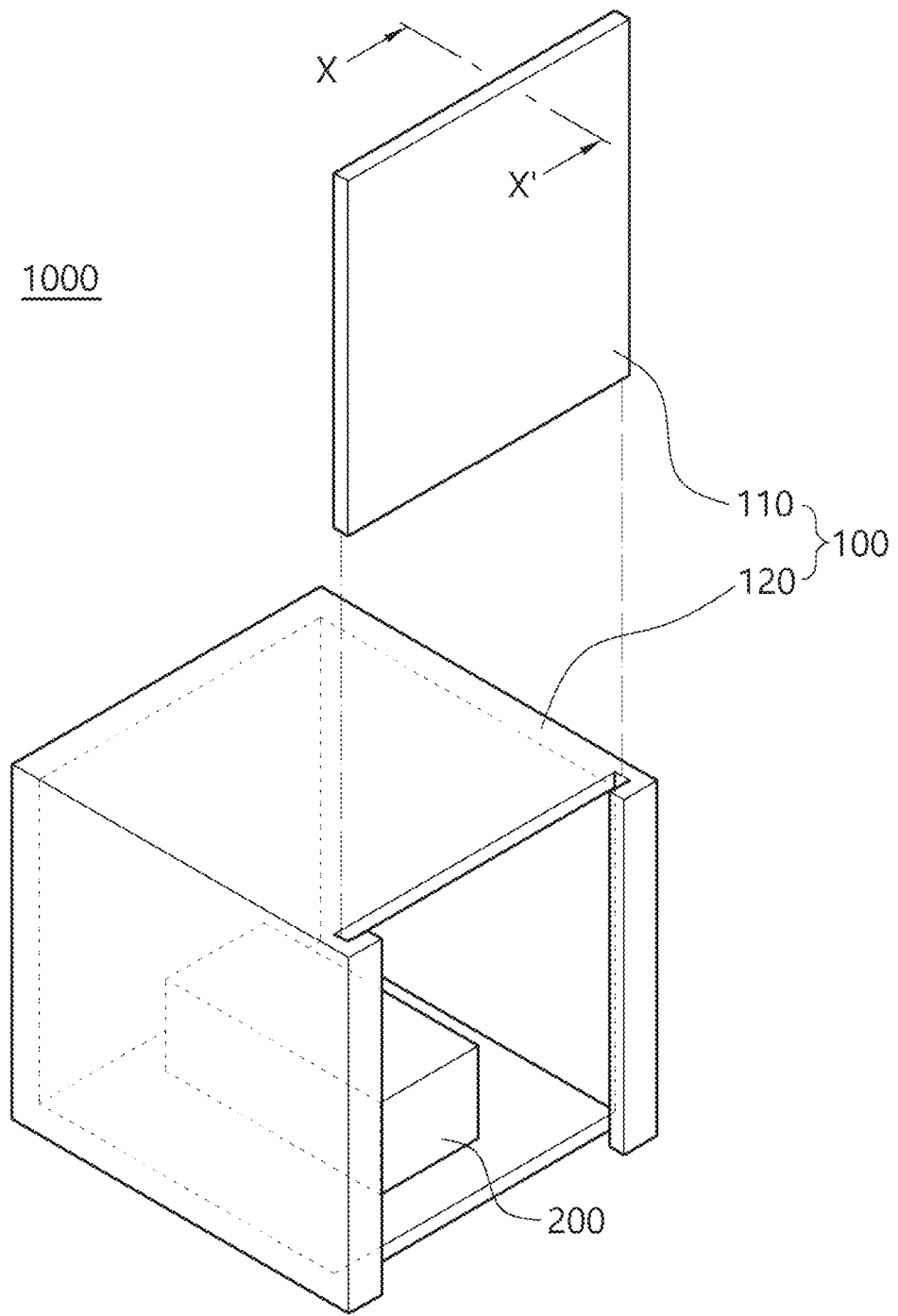
FIG. 1 is an assembly perspective view of a repeater according to an embodiment of the present invention.

Hereinafter, exemplary embodiments of the present invention will be described in detail so that those of ordinary skill in the art can readily implement the present invention with reference to the accompanying drawings. The present invention may be embodied in many different forms and is not limited to the embodiments set forth herein. In the drawings, parts unrelated to the description are omitted for clarity. Throughout the specification, like reference numerals denote like elements.

Referring to FIGS. 1 to 4, the housing for repeater 100 according to an embodiment of the present invention has an accommodation part in which a repeating part 200 including a device for repeating an RF signal is accommodated therein. At least a portion of the housing 100 is formed of a heat dissipation plastic 110 or 110', and may be entirely formed of a heat dissipation plastic 110 or 110'.

The heat dissipation plastic 110 or 110' has a relative permittivity of 4 or less at a frequency of 28 GHz and a thermal conductivity of 3 W/mK or more. In addition, as an example, the relative permittivity may be 3 or less at a frequency of 28 GHz, and more preferably 2.7 or less.

In addition, as an example, the relative permittivity may be implemented to have a low dielectric characteristic of 4 or less at 1 GHz, 5 GHz, 10 GHz, 15 GHz, 20 GHz, 25 GHz, 30 GHz, or 35 GHz.

In addition, at a frequency of 2 to 30 GHz, the relative permittivity may be 4 or less, preferably the relative permittivity may be 3 or less, and more preferably, the relative permittivity may be 2.7 or less. The heat dissipation plastic 110 or 110' expressing such low dielectric characteristics has an advantage of preventing disturbance of the RF signal received by the repeating part 200 or transmitted from the repeating part 200 or attenuation or blocking of the signal.

In addition, since the heat dissipation plastic 110 or 110' expresses the same low dielectric characteristics but has a thermal conductivity of 3 W/mk or more, preferably 10 W/mk or more, and more preferably 20 W/mk or more, it can express even excellent heat dissipation characteristics, thereby capable of transferring the high heat emitted through the repeating part 200 to the outside within a short time.

The heat dissipation plastic 110 or 110' included in an embodiment of the present invention having the above-described physical properties include a heat dissipation layer 10 including a matrix 11 and a heat dissipation filler 12 or 12' dispersed in the matrix, and may further include a protective layer 20 covering the outer surface of the heat dissipation layer 10.

The matrix 11 of the heat dissipation layer 10 is a layer that gives the shape and mechanical strength of the heat dissipation plastic, and may include as a main agent a known thermoplastic polymer compound that can be implemented to have a predetermined thickness or more that cannot be formed with a coating composition. The thermoplastic polymer compound may be, for example, one compound, a mixture or copolymer of two or more selected from the group consisting of, for example, polyamide, polyester, polyketone, liquid crystal polymer, polyolefin, polyvinyl chloride, polyphenylene sulfide (PPS), polyether ether ketone (PEEK), polyphenylene oxide (PPO), polyether sulfone (PES), polyphenylene ether (PPE), polyphenylene ether/polyamide alloy, polyphenylene ether/polypropylene alloy, polyphenylene ether/polysulfone alloy, acrylonitrile-butadiene-styrene copolymer (ABS), polyetherimide (PEI) and polyimide. However, in consideration of mechanical strength, light weight, moldability and dielectric characteristics, the thermoplastic polymer compound may be one or more selected from the group consisting of polyphenyl ether (PPE), polyphenyl ether/polystyrene alloy, polyphenyl ether/polypropylene alloy, polyphenyl ether/polyamide alloy, and liquid crystal polymer (LCP).

In addition to the main agent, that is, the above-described thermoplastic polymer compound, the matrix 11 may further contain other additive agents such as strength improving agents, impact modifiers, antioxidants, heat stabilizers, photostabilizers, plasticizers, dispersants, work improving agents, coupling agents, UV absorbents, antistatic agents and flame retardants.

Any known components capable of improving the strength of heat dissipation plastics can be used as the strength improving agent without limitation, and non-limiting examples thereof may include one or more of components selected from the group consisting of carbon fiber, glass fiber, glass beads, zirconium oxide, wollastonite, gibbsite, boehmite, magnesium aluminate, dolomite, calcium carbonate, magnesium carbonate, mica, talc, silicon carbide, kaolin, calcium sulfate, barium sulfate, silicon dioxide, ammonium hydroxide, magnesium hydroxide and aluminum hydroxide.

In addition, any known components capable of improve the impact resistance by the impact modifier expressing the flexibility and stress relaxation properties of heat dissipation plastics can be used as the impact modifier, and examples thereof may include one or more of components among thermoplastic polyurethane (TPU), thermoplastic polyolefin (TPO), maleic acid-grafted EPDM, elastic particles having a core/shell structure, and a rubber-based resin. The thermoplastic polyolefin is a group of materials similar to rubber, and may be a linear polyolefin block copolymer having a polyolefin block such as polypropylene or polyethylene and a rubber block or a polypropylene blended with an ethylene-propylene-diene monomer (EPDM), an ethylene-based elastomer, and since the specific thermoplastic polyolefin may use a known one, in the present invention, a description of specific types thereof is omitted. In addition, since the thermoplastic polyurethane may also use a known one, the description of specific types is omitted. In addition, in the case of elastic particles having a core/shell structure, for example, the core may use an allyl-based resin, and the shell portion may be a polymer resin having a functional group capable of reacting to increase compatibility and bonding strength with the thermoplastic polymer compound.

In addition, the antioxidant is provided to inhibit the generation of radicals due to heat and/or shear stress during extrusion and injection to prevent the main chain of the thermoplastic polymer compound from breaking, and to prevent discoloration due to heat generated in secondary processing. The antioxidant may use any known antioxidant without limitation, and non-limiting examples thereof may include organo-phosphites such as tris(nonylphenyl)phosphite, tris(2,4-di-t-butylphenyl)phosphite, bis(2,4-di-t-butylphenyl)pentaerythritol diphosphite, distearyl pentaerythritol diphosphite or the like; alkylated monophenol or polyphenol; alkylated reaction products of polyphenol with diene, such as tetrakis[methylene(3,5-di-tert-butyl-4-hydroxyhydrocinnamate)]methane, or the like; butylated reaction products of para-cresol or dicyclopentadiene; alkylated hydroquinone; hydroxylated thiodiphenyl ether; alkylidene-bisphenol; benzyl compound; esters of monohydric or polyhydric alcohols with beta-(3,5-di-tert-butyl-4-hydroxyphenyl)-propionic acid; esters of monohydric or polyhydric alcohols with beta-(5-tert-butyl-4-hydroxy-3-methylphenyl)-propionic acid; esters of thioalkyl or thioaryl compounds such as distearylthiopropionate, dilaurylthiopropionate, ditridecylthiopropionate, octadecyl-3-(3,5-di-tert-butyl-4-hydroxyphenyl)propionate, pentaerythrityl-tetrakis [3-(3,5-di-tert-butyl-4-hydroxyphenyl) propionate or the like; amide of beta-(3,5-di-tert-butyl-4-hydroxyphenyl)-propionic acid or the like, or mixtures thereof. The antioxidant may be provided in an amount of 0.01 to 0.5 parts by weight based on 100 parts by weight of the thermoplastic polymer compound.

The heat stabilizer may use any known heat stabilizer without limitation, and non-limiting examples thereof may include organo-phosphites such as triphenyl phosphite, tris-(2,6-dimethylphenyl)phosphite, tris-(mixed mono- and di-nonylphenyl)phosphite or the like; phosphonates such as dimethylbenzene phosphonate or the like, phosphates such as trimethyl phosphate, or the like, or mixtures thereof. The heat stabilizer may be included in an amount of 0.01 to 0.5 parts by weight based on 100 parts by weight of the thermoplastic polymer compound.

The photostabilizer may use a known heat stabilizer without limitation, and non-limiting examples thereof may include benzotriazoles such as 2-(2-hydroxy-5-methylphenyl)benzotriazole, 2-(2-hydroxy-5-tert-octylphenyl)-benzotriazole and 2-hydroxy-4-n-octoxybenzophenone or the like, or mixtures thereof.

In addition, the plasticizer may use any known plasticizer without limitation, and non-limiting examples thereof may include phthalic acid esters such as dioctyl-4,5-epoxy-hexahydrophthalate, tris-(octoxycarbonylethyl)isocyanurate, tristearin, epoxidized soybean oil or the like, or mixtures thereof. The plasticizer may be included in an amount of 0.5 to 3.0 parts by weight based on 100 parts by weight of the thermoplastic polymer compound.

In addition, the antistatic agent may use any known antistatic agent without limitation, and non-limiting examples thereof may include glycerol monostearate, sodium stearyl sulfonate, sodium dodecylbenzenesulfonate, polyether block amide, or mixtures thereof; which are commercially available, for example, from BASF under the trade name Irgastat; Arkema under the trade name PEBAX; and from Sanyo Chemical industries under the trade name Pelestat. The antistatic agent may be included in an amount of 0.1 to 2.0 parts by weight based on 100 parts by weight of the thermoplastic polymer compound.

In addition, the work improving agent may use any known work improving agent without limitation, and non-limiting examples may include metal stearate, stearyl stearate, pentaerythritol tetrastearate, beeswax, montan wax, paraffin wax, polyethylene wax or the like, or mixtures thereof. The work improving agent may be included in an amount of 0.1 to 1.0 parts by weight based on 100 parts by weight of the thermoplastic polymer compound.

In addition, the UV absorbent may use any known UV absorbent without limitation, and non-limiting examples thereof may include hydroxybenzophenone; hydroxybenzotriazole; hydroxybenzotriazine; cyanoacrylate; oxanilide; benzoxazinone; 2-(2H-benzotriazol-2-yl)-4-(1,1,3,3,-tetramethylbutyl)-phenol; 2-hydroxy-4-n-octyloxybenzophenone; 2-[4,6-bis(2,4-dimethylphenyl)-1,3,5-triazin-2-yl]-5-(octyloxy)-phenol; 2,2'-(1,4-phenylene)bis(4H-3,1-benzoxazin-4-one); 1,3-bis[(2-cyano-3,3-diphenylacryloyl) oxy]-2,2-bis[[(2-cyano-3,3-biphenylacryloyl)oxy]methyl]

propane; 2,2'-(1,4-phenylene)bis(4H-3,1-benzoxazin-4-one); 1,3-bis[[(2-cyano-3,3-diphenylacryloyl)oxyl-2,2-bis[[(2-cyano-3,3-diphenylacryloyl)oxy]methyl]propane; nano-sized inorganic materials such as titanium oxide, cerium oxide and zinc oxide having a particle size of less than 100 nm; or the like, or mixtures thereof. The UV absorbent may be included in an amount of 0.01 to 3.0 parts by weight based on 100 parts by weight of the thermoplastic polymer compound.

In addition, a component known as a dispersant of the heat dissipation filler may be used without limitation as the dispersant. Non-limiting examples thereof may include polyester-based dispersant, polyphenylene ether-based dispersant; polyolefin-based dispersant, acrylonitrile-butadiene-styrene copolymer dispersant, polyarylate-based dispersant, polyamide-based dispersant, polyamideimide-based dispersant, polyarylsulfone-based dispersant, polyetherimide-based dispersant, polyethersulfone-based dispersant, poly phenylene sulfide-based dispersant, polyimide-based dispersants; polyether ketone-based dispersant, polybenzoxazole-based dispersant, polyoxadiazole-based dispersant, polybenzothiazole-based dispersant, polybenzimidazole-based dispersant, polypyridine-based dispersant, polytriazole-based dispersant, polypyrrolidine-based dispersant, polydibenzofuran-based dispersant, polysulfone-based dispersant, polyurea-based dispersant, polyurethane-based dispersant, or polyphosphazene-based dispersant, and alone among these or a mixture or copolymer of two or more selected from them may be used.

The dispersant may be included in an amount of 0.2 to 6.0 parts by weight based on 100 parts by weight of the heat dissipation filler.

In addition, the coupling agent may use any known coupling agent without limitation, and as a non-limiting example, it may use in combination one or more selected from the group consisting of silane-based coupling agent, amine-based coupling agent, maleic acid grafted polypropylene (MAH-g-PP), and maleic acid grafted EPDM (MAH-g-EPDM). In addition, the coupling agent may be included in an amount of 0.01 to 8.0 parts by weight based on 100 parts by weight of the thermoplastic polymer compound.

In addition, the flame retardant may include, but not limited thereto, for example, halogenated flame retardant, like tretabromo bisphenol A oligomer such as BC58 and BC52, brominated polystyrene or poly(dibromo-styrene), brominated epoxy, decabromodiphenyleneoxdide, pentabromine penzyl acrylate monomer, pentabromobenzyl acrylate polymer, ethylene-bis(tetrabromophthalimide), bis(pentabromobenzyl)ethane, metal hydroxide such as $Mg(OH)_2$ and $Al(OH)_3$, melamine cyanurate, phosphor-based FR system such as red phosphorus, melamine polyphosphate, phosphate ester, metal phosphinate, ammonium polyphosphate, expandable graphite, sodium or potassium perfluorobutane sulfate, sodium or potassium perfluorooctane sulfate, sodium or potassium diphenylsulfonesulfonate and sodium- or potassium-2,4,6,-trichlorobenzonate and N-(p-tolylsulfonyl)-p-toluenesulfimide potassium salt, N-(N'-benzylaminocarbonyl) sulfanylimide potassium salt, or mixtures thereof.

Next, the heat dissipation filler 12 or 12' are components that impart thermal conductivity to the heat dissipation plastic 110 or 110'. The heat dissipation filler 110 or 110' may use any heat dissipation filler with thermal conductivity without limitation, but when the heat dissipation filler imparts conductivity to the heat dissipation plastic or lowers the permittivity, since it may interfere with or block transmission and reception of RF signals in a high frequency band it is preferable to use a type of heat dissipation filler having a low permittivity or resistance. As an example for this, it is advantageous to use the heat dissipation filler 12 or 12' having a resistance of $1 \times 10^{14} \Omega$ or more to achieve a desired level of relative permittivity of the heat dissipation plastic. Specifically, as the heat dissipation filler, alumina, yttria, zirconia, aluminum nitride, boron nitride, silicon nitride, silicon carbide, single crystal silicon, etc. may be used.

Preferably, the heat dissipation filler 12 or 12' may include a relative permittivity of 4 or less at a frequency of 28 GHz. If the relative permittivity exceeds 4 at the frequency, it may be difficult to achieve a desired level of relative permittivity on the heat dissipation plastic, and in particular, if the heat dissipation filler in the heat dissipation plastic is provided with a high content, it may be more difficult to achieve a desired level of relative permittivity of the heat dissipation plastic, or it may be difficult to guarantee mechanical strength. In terms of relative permittivity and resistance as described above, the heat dissipation filler 12 or 12' may include, for example, one or more selected from the group consisting of alumina, aluminum nitride, boron nitride, silicon nitride, silicon carbide, and single crystal silicon, and preferably one or more of aluminum nitride, boron nitride, silicon nitride, and silicon carbide, but is not limited thereto.

The heat dissipation filler 12 or 12' may be included in an amount of 50% by weight or more based on the total weight of the heat dissipation plastic, and through this, sufficient heat dissipation characteristics may be expressed at a desired level. If it is provided in less than 50% by weight, it may be difficult to provide a desired heat dissipation characteristic. However, preferably, the heat dissipation filler may be provided in an amount of 90 wt % or less, more preferably 70 wt % or less, and through this, it may be advantageous to maintain a level of mechanical strength that can be used as a housing, and maintain heat dissipation characteristics.

Figure 2:
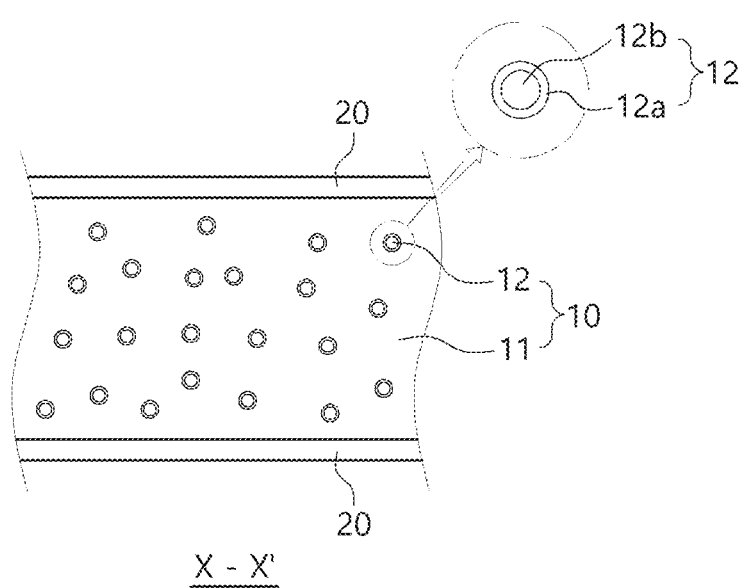
FIG. 2 and FIG. 3 are cross-sectional mimetic diagrams of a cover member according to various exemplary embodiments of the present invention, specifically, cross-sectional mimetic diagrams taken along a boundary line X-X' of a cover member in FIG. 1.

Alternatively, as shown in FIG. 2, the heat dissipation filler 12 may be a heat dissipation filler having a structure including a thermally conductive core part 12a and an insulating film 12b covering the core part 12a. As described above, in order for the heat dissipation plastics 110 and 110' to have a low permittivity, the permittivity of the heat dissipation filler should be low and the resistance should be high, a heat dissipation filler having such electrical characteristics may have somewhat low thermal conductivity, so it may be difficult to expect high heat dissipation characteristics. Accordingly, when the heat dissipation filler having high heat dissipation characteristics is disposed in the thermally conductive core part and the heat dissipation filler is manufactured in a structure in which an insulating film is provided to surround the core portion, there is an advantage that high heat dissipation characteristics and insulating properties can be achieved at the same time. For example, the thermally conductive core part may be a carbon-based filler such as graphite, and the insulating film may be silicon oxide.

In addition, the heat dissipation filler 12 or 12' may have a spherical shape or a plate-like granular shape, and may have a plate-like shape in terms of improving thermal conductivity in the horizontal direction.

In addition, the heat dissipation filler 12 or 12 may have an average particle size of 1 to 200 μm. For example, the heat dissipation filler may have an average particle size of 1 to 100 μm, 1 to 50 μm, 10 to 50 μm, or 10 to 30 μm. When the particle size of the heat dissipation filler is adjusted to an appropriate level, it is easy to provide the heat dissipation filler with a high content in the heat dissipation plastic, the dispersibility of the heat dissipation filler may be improved, the surface quality of the heat dissipation layer 10 may be also improved, and it is possible to prevent detachment such as heat dissipation filler coming off the surface. The heat dissipation filler may have an average particle size of 1 μm or more, through which dispersibility and content in the matrix may be further increased, thereby further improving thermal conductivity. Meanwhile, in the present invention, the particle size of the heat dissipation filler is the diameter when the shape is spherical, and when the shape is polyhedral or irregular, it means the longest distance among the linear distances between two different points on the surface.

In addition, according to an embodiment of the present invention, the particle size of the heat dissipation filler may be controlled so that the heat dissipation filler 12 or 12' includes a first heat dissipation filler having a particle size of 0.2 to 0.8 μm, a second heat dissipation filler having a particle size of 3 to 7 μm, and a third heat dissipation filler having a particle size of 25 to 50 μm for more improved heat dissipation characteristics and mechanical strength. For example, the heat dissipation filler 12 or 12' may use a first heat dissipation filler having a particle size of 0.5 μm, a second heat dissipation filler having a particle size of 4 μm, and a third heat dissipation filler having a particle size of 30 μm. More preferably, the first heat dissipation filler, the second heat dissipation filler and the third heat dissipation filler may be included in a weight ratio of 1:1.7 to 3.0:9.0 to 11.0, thereby achieving a more elevated effect in the above-mentioned desired physical properties. If any one or more of the first heat dissipation filler, the second heat dissipation filler, and the third heat dissipation filler is designed to deviate from the above-mentioned particle size range, or if these contents are included in the heat dissipation filler to exceed the above-mentioned range, it may be difficult to achieve the desired effect.

In addition, the heat dissipation filler 12 or 12' is provided in a dispersed form in the matrix 11, and the interface formed between the matrix and the heat dissipation filler may have reduced thermal conductivity at the interface due to low compatibility from heterogeneous materials. Therefore, even if the heat dissipation filler has excellent thermal conductivity, the heat dissipation performance of the heat dissipation plastic may be implemented low. In addition, there may be a lifting phenomenon at the interface. In this case, the heat dissipation performance may be further deteriorated, and there is a risk that the durability of the heat dissipation plastic may be deteriorated, such as cracks occurring in the corresponding portion. Accordingly, the heat dissipation filler may be surface-treated or surface-modified to improve the matrix and interfacial properties to be described later.

The surface treatment may be to remove heterogeneous inorganic substances or impurities adhered to the surface of the heat dissipation filler 12 or 12', and through this surface treatment, the heat conduction characteristics of the heat dissipation filler itself may be fully exhibited, and the interfacial properties with the matrix may be advantageously improved.

In addition, the surface modification may be used without limitation in the case of known modification capable of increasing compatibility between the heat dissipation filler 12 or 12' and the components forming the matrix 11. For example, the surface modification may be a modification in which one or more functional groups selected from the group consisting of a hydroxyl group, an alkyl group, an alkane group, an amine group and an aniline group, preferably selected from the group consisting of a hydroxyl group, an amine group and an aniline group, and more preferably selected from the group consisting of an amine group and an aniline group, is provided on the surface of the heat dissipation filler 12 or 12'.

The surface treatment or surface modification can be carried out by employing a known method, for example, it may be carried out through acid treatment. The acid treatment may be performed by treating an acidic solution such as nitric acid-based, sulfuric acid-based, aluminum-based, and titanium-based in the heat dissipation filler, preferably sulfuric acid-based or nitric acid-based solution is good to express more improved thermal conductivity and relative permittivity characteristics. Through the acid treatment, it is possible not only to remove inorganic substances or contaminants attached to the surface of the heat dissipation filler, but also to provide a hydroxyl functional group on the surface.

Meanwhile, after acid treatment, the surface of boron nitride can be changed to be rougher. The change in surface morphology, such as an increase in the roughness of the surface of the heat dissipation filler, has the effect of structurally improving the bonding force at the interface with the matrix, and through this, it is advantageous to achieve improved thermal conductivity, relative permittivity characteristics and durability.

As an example, describing the method of performing the acid treatment, it may go through a process in which 6 to 30 g of a heat dissipation filler per 100 g of an acidic solution is added, stirred at 20 to 100° C. for 1 to 10 hours, and then neutralized by adding the heat dissipation filler to water, and then washed with distilled water. In this case, in the step of stirring after being added to the acidic solution, ultrasonic waves may be additionally added during or after stirring.

The heat dissipation plastic 110 or 110' having the matrix 11 and the heat dissipation filler 12 or 12' described above may be implemented through a known method that can be manufactured to have a predetermined thickness and area using a thermoplastic material, and for example, it may be manufactured through methods such as extrusion molding and injection molding, and the present invention is not particularly limited with respect to the method for manufacturing the heat dissipating plastic.

In the meantime, the heat dissipation plastic 110 or 110' may further include a protective layer 20 on at least one surface, and the protective layer 20 acts to protect the heat dissipation layer 10 from external physical/chemical stimuli and to prevent the heat dissipation filler 12 or 12' from being detached to the outside. In addition, when the protective layer 20 is implemented with an insulating material, it is possible to further impart insulation to the heat dissipation plastic.

The protective layer 20 may be implemented with a known thermosetting polymer compound or a thermoplastic polymer compound. The thermosetting polymer compound may be one compound selected from the group consisting of epoxy-based, urethane-based, ester-based and polyimide-based resins, or a mixture or copolymer of two or more selected therefrom. In addition, the thermoplastic polymer compound may be one compound selected from the group consisting of polyamide, polyester, polyketone, liquid crystal polymer, polyolefin, polyphenylene sulfide (PPS), polyether ether ketone (PEEK), polyphenylene oxide (PPO), polyether sulfone (PES), polyetherimide (PEI), and polyimide, or a mixture or copolymer of two or more selected therefrom, but is not limited thereto.

The protective layer 20 may have a thickness of 0.1 to 1000 μm, but is not limited thereto, and may be implemented by changing it according to the purpose.

In addition, the protective layer 20 may include a heat dissipation filler having a low permittivity in order to express heat radiation characteristics to the outside air. When the protective layer 20 is provided with a heat dissipation filler, the thickness may be 10 to 50 μm, and when the thickness exceeds 50 μm, there is a problem that radiation characteristics may be significantly reduced.

In addition, the protective layer 20 may further include a known pigment to impart a predetermined color to the heat dissipation plastic.

The protective layer 20 may be formed by treating the coating composition in which the above-described polymer compound is dissolved on the outer surface of the already implemented heat dissipation layer 10, or may be implemented through double injection together with the heat dissipation layer 10 through a thermoplastic polymer compound.

In addition, the heat dissipation plastic 110 or 110' may have a thickness of 0.1 to 10 mm, for example, 0.5 to 10 mm. On the other hand, in the case of the heat dissipation plastic 110 or 110' having a thickness of 0.1 mm or more, particularly 0.5 mm or more, it is very difficult to manufacture through a conventional coating composition, so it is noted clear that it is very difficult or impossible to manufacture a heat dissipation plastic satisfying the thickness range of the present invention through the coating composition even if the composition is similar to the present invention.

The above-described heat dissipation plastic 110 or 110' may form a part or all of the housing 100, and when described as being provided as a part, the housing 100 may be composed of a first part that is a heat dissipation plastic 110 or 110' and a second part 120 that is a part other than that.

For example, as shown in FIG. 1, one side of the housing 100 is open, and the heat dissipation plastic 110 may be provided as a cover member for opening and closing one side of the open housing 100. In this case, the second part 120 of the housing 100 may be a known material used as a housing for repeater, for example, may be polycarbonate. The open side of the housing 100 may be provided with a groove corresponding to the thickness of the cover member so that the cover member can be coupled, but is not limited thereto, and the cover member may be coupled to the open side of the housing through a separate fixing member such as a hinge.

Figure 3:
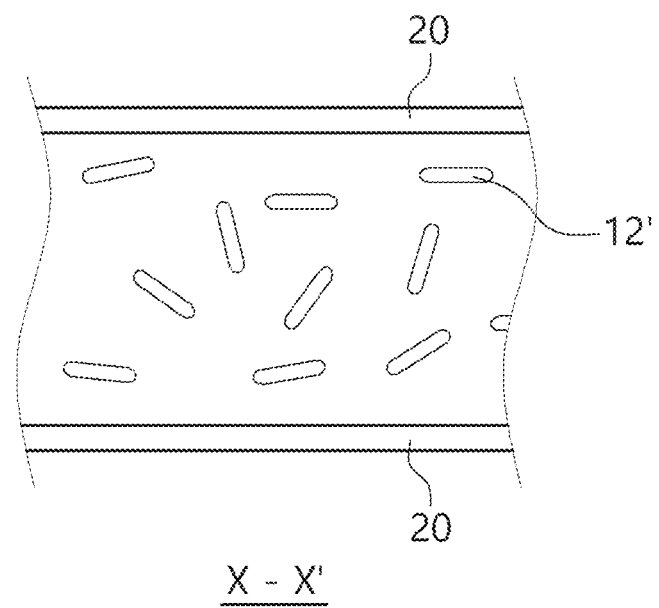
Figure 4:
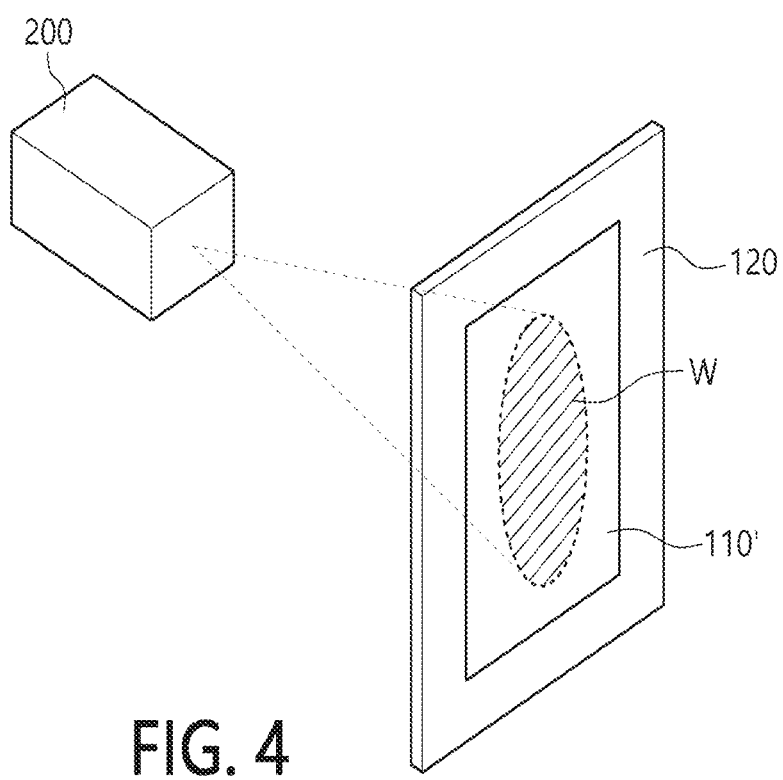
FIG. 4 is a mimetic diagram of another embodiment of a heat dissipation plastic provided in a housing according to an exemplary embodiment of the present invention.

Alternatively, in consideration of the position of the repeating part 200 provided in the repeater 1000 and the signal path region W in the high frequency band for transmission and reception, as shown in FIG. 3, the heat dissipation plastic 110' may be provided only in a partial region of the cover member including the signal path region W region, and the cover member may include the second part 120 together other than the heat dissipation plastic. In this case, it may prevent signal interference or blockage and achieve heat dissipation characteristics through the heat dissipation plastic 110', which is the first part of the cover member, and at the same time may achieve higher heat dissipation characteristics through the second part 120.

The housing 100 having the heat dissipation plastic 110 or 110' described above implements a repeater 1000 including a repeating part 200 for repeating an RF signal therein.

The repeating part 200 may be an electric/electronic device provided in a known repeater, for example, a Front End Unit (FEU), a Quad Base Radio (QBR), a Router/Site Reference Interface (SRI), a Channel Service Unit (CSU), an optical end station device, a rectifier, and the like.

In addition, the repeater 1000 may further include a heat sink (not shown) or a fan (not shown) inside or outside the housing 100 in order to increase the heat dissipation characteristics of the heat generated inside the repeater.

Meanwhile, the repeater 1000 may further include other components that may be further provided in a known repeater in addition to the above-described components, and the present invention is not particularly limited thereto.

MODE FOR CARRYING OUT THE INVENTION

The present invention will be described in more detail through the following embodiments, but the following embodiments are not intended to limit the scope of the present invention, which should be construed to aid understanding of the present invention.

Embodiment 1

40% by weight of polypropylene as a matrix forming component, 59% by weight of boron nitride having an average particle size of 30 μm as a heat dissipation filler, and 1% by weight of other dispersants and oxidizers are mixed through a twin extruder, then put into a single compressor and through a T-die, a heat dissipation plastic having a thickness of 0.6 mm as shown in Table 1 was prepared.

Embodiment 2 to 5

A heat dissipation plastic was prepared in the same manner as in Embodiment 1, but the matrix forming component was changed as shown in Table 1 below or the type and content of the heat dissipation filler were changed to prepare the heat dissipation plastic as shown in Table 1 below.

Comparative Example 1

A heat dissipation plastic was prepared in the same manner as in Embodiment 1, but as shown in Table 1 below, the matrix forming component was changed to a polyurethane resin (PPU), and a general glass fiber was added to reinforce the strength of the polyurethane resin, thereby changing the composition to be 30 wt % of polyurethane resin and 10 wt % of glass fiber based on the total weight, to prepare the heat dissipation plastic as shown in Table 1.

Comparative Example 2 heat dissipation plastic was prepared in the same manner as in Embodiment 1, but as shown in Table 1 below, the type of heat dissipation filler was changed to alumina to prepare the heat dissipation plastic as shown in Table 1 below.

Experimental Example 1

The following physical properties were evaluated for the heat dissipation plastics prepared in Embodiments 1 to 5 and Comparative Examples 1 to 2, and the results are shown in Table 1.

1. Relative Permittivity

The relative permittivity was measured according to IEC 62333-1.

2. Thermal Conductivity

The thermal conductivity was calculated through the thermal diffusivity measured using LFA, the specific heat measured by DSC, and the density of the heat dissipation sheet.

TABLE 1

|  | Embodiment 1 | Embodiment 2 | Embodiment 3 | Embodiment 4 | Embodiment 5 | Comparative Example 1 | Comparative Example 2 |
|---|---|---|---|---|---|---|---|
| Matrix forming component | polypropylene | polyphenylene ether | polyphenylene ether/polysulfone | polypropylene | polyphenylene ether/polysulfone | PPU 30% by weight + glass fiber 10% by weight | polypropylene |
| Heat dissipation filler (type/average particle size (μm)/content (% by weight)) | BN/30/59 | BN/30/59 | BN/30/59 | BN/30/35 | BN/30/48 | BN/30/59 | alumina/30/59 |
| Relative permittivity (@28 GHz) | 3.5 | 3.5 | 3.7 | 3.0 | 3.5 | 8 | 4.5 |
| Thermal conductivity (W/mK) | 7.0 | 7.0 | 7.0 | 3.2 | 5.0 | 6.7 | 1.5 |

As can be seen from Table 1, Embodiments 1 to 5 are heat dissipation plastics belonging to the present invention that satisfy a relative permittivity of 4.0 or less at 28 GHz and a thermal conductivity of 3 W/mK or more, whereas In Comparative Examples 1 and 2, the relative permittivity and/or thermal conductivity do not satisfy the scope of the present invention.

Embodiment 6 to 13

A heat dissipation plastic was prepared in the same manner as in Embodiment 1, but the particle size and content of the heat dissipation filler were adjusted as shown in Table 2 to prepare the heat dissipation plastic shown in Table 2 below.

Experimental Example 2

It was evaluated in the same manner as in Experimental Example 1, and the results are shown in Table 2 below.

On the other hand, the flexural strength was evaluated by the method of ASTM D 790.

TABLE 2

|  |  | Embodiment 6 | Embodiment 7 | Embodiment 8 | Embodiment 9 | Embodiment 10 | Embodiment 11 | Embodiment 12 | Embodiment 13 |
|---|---|---|---|---|---|---|---|---|---|
| Heat dissipation plastic thickness (mm) | | 0.6 | 0.6 | 0.6 | 0.6 | 0.6 | 0.6 | 0.6 | 0.6 |
| Heat dissipation filler | Total content (wt %) | 59 | 59 | 59 | 59 | 59 | 59 | 59 | 59 |
|  | A (μm) | 0.5 | — | — | 0.5 | — | 0.5 | 0.5 | 0.1 |
|  | B (μm) | — | 4 | — | — | 4 | 4 | 10 | 4 |
|  | C (μm) | — | — | 35 | 35 | 35 | 35 | 35 | 10 |
|  | A:B:C weight ratio | — | — | — | 3:9.5 | 3:9.5 | 1:2:9.5 | 1:2:9.5 | 1:2:9.5 |
| Relative permittivity (@28 GHz) | | 3.6 | 3.5 | 3.5 | 3.5 | 3.5 | 3.5 | 3.5 | 3.5 |
| Thermal conductivity (mK) | | 3.8 | 4.9 | 7 | 7.1 | 7.2 | 8.3 | 7.3 | 5.6 |
| Flexural strength (kg/cm$^2$) | | 220 | 230 | 250 | 250 | 270 | 290 | 300 | 250 |

Comparative Example 3

A heat dissipation plastic was manufactured in the same manner as in Embodiment 1, but the type of heat dissipation filler was changed to graphite having an average particle size of 75 µm to prepare the heat dissipation plastic as shown in Table 3 below.

Experimental Example 3

For Embodiment 1 and Comparative Example 3, the relative permittivity and thermal conductivity according to Experimental Example 1 were evaluated in the same manner, and the results are shown in Table 3 below.

Figure 5A:
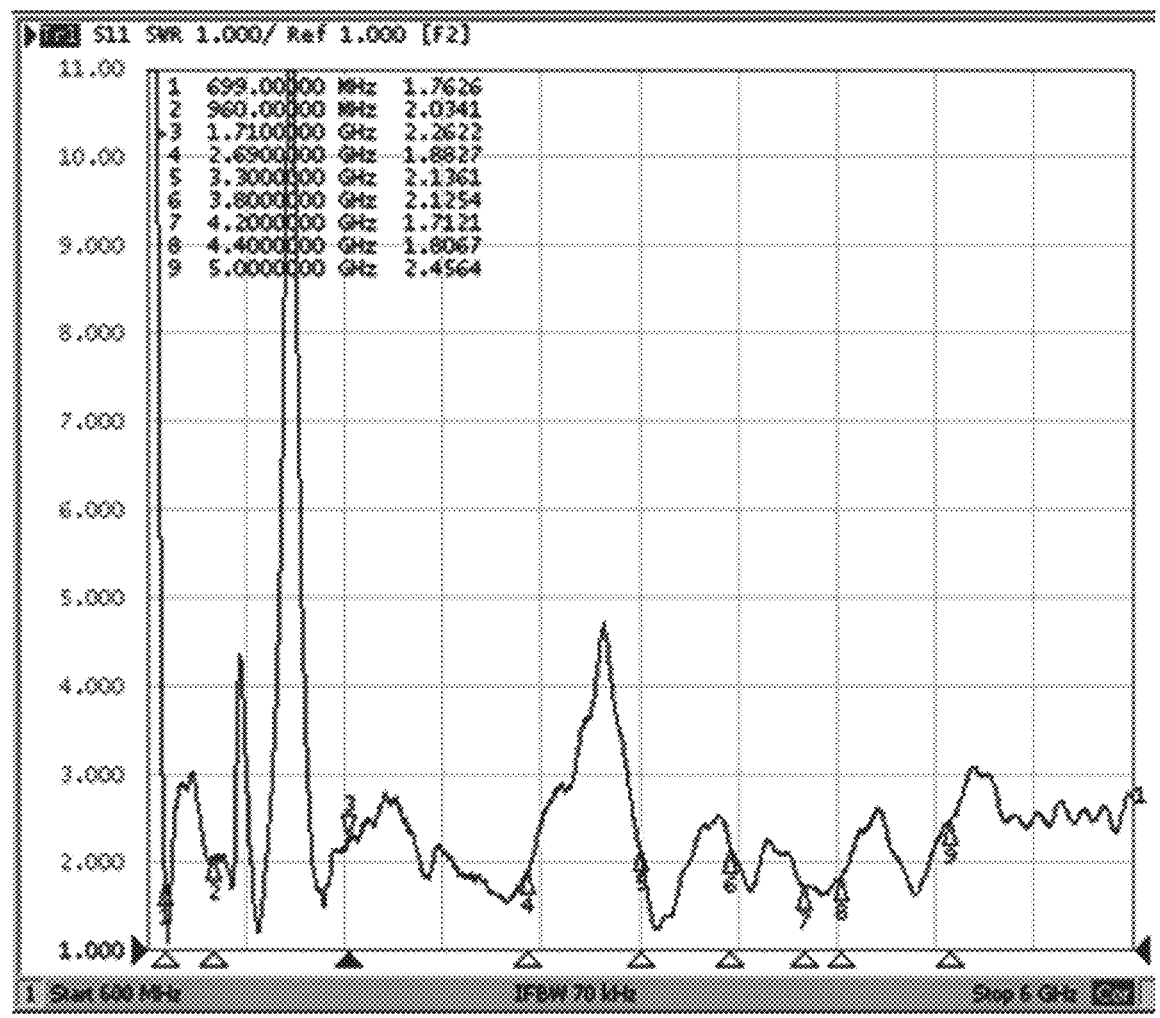
Figure 5B:
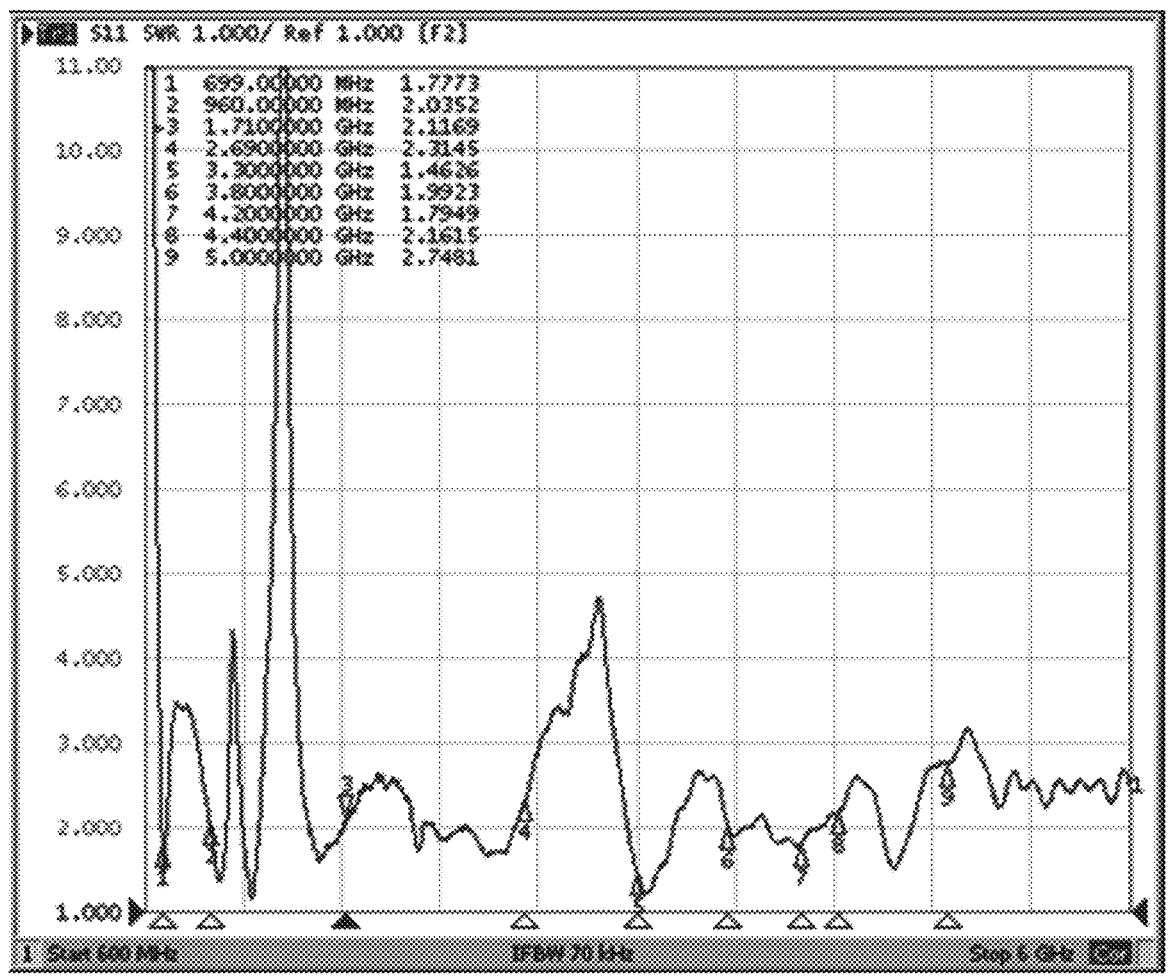
Figure 5C:
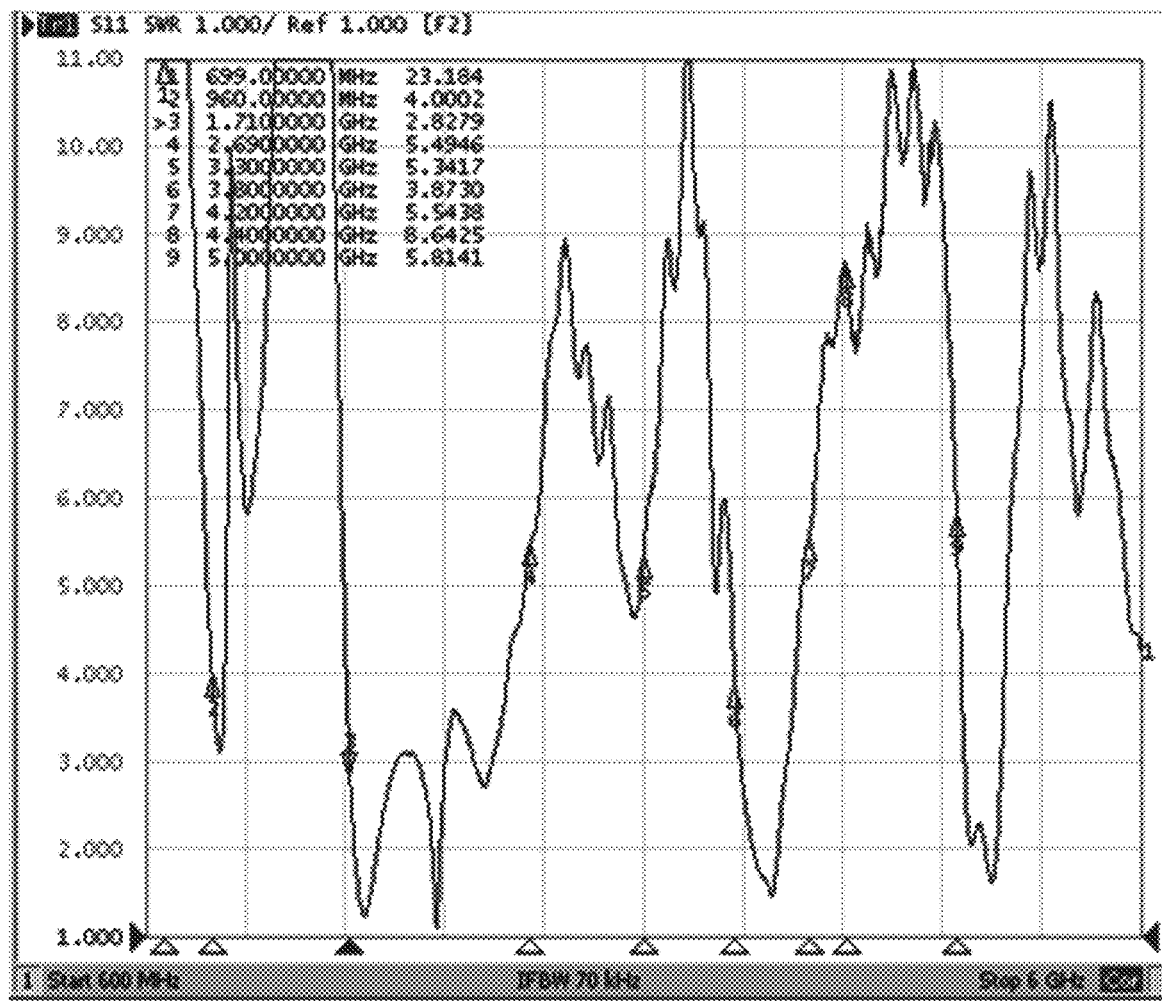
Figure 6A:
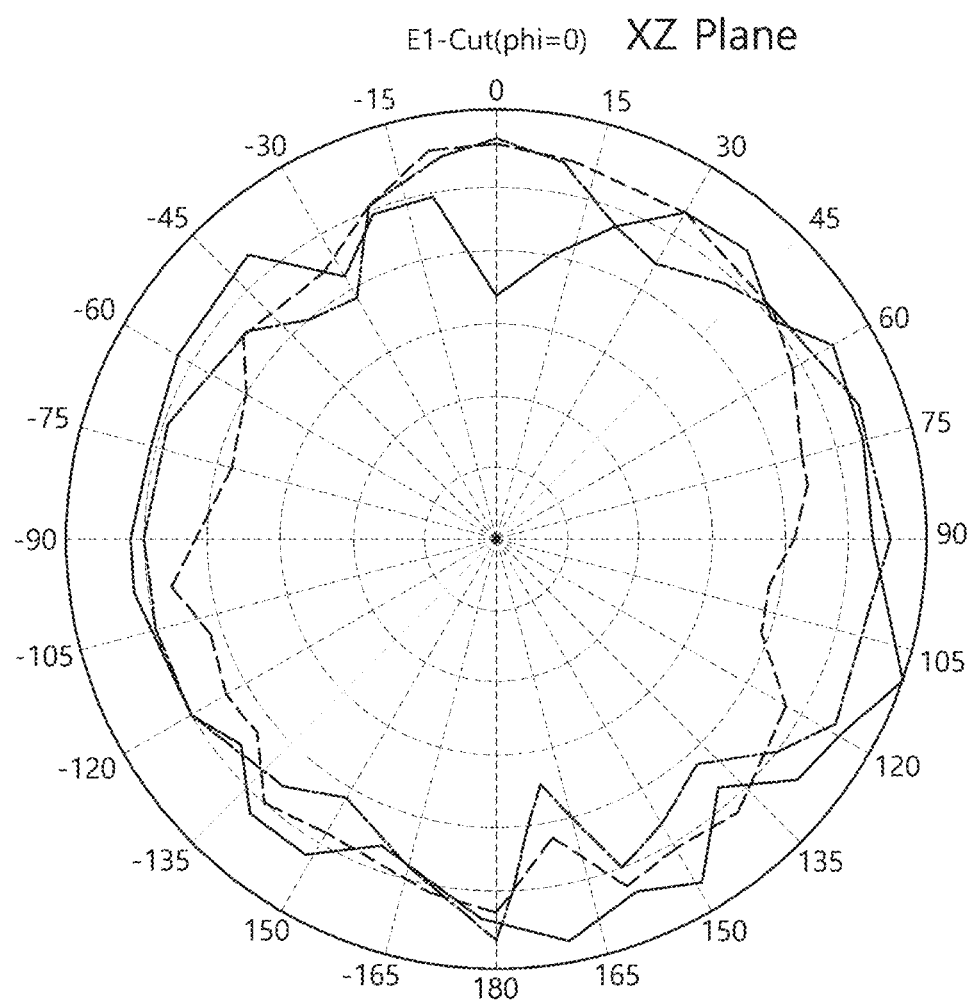
Figure 6B:
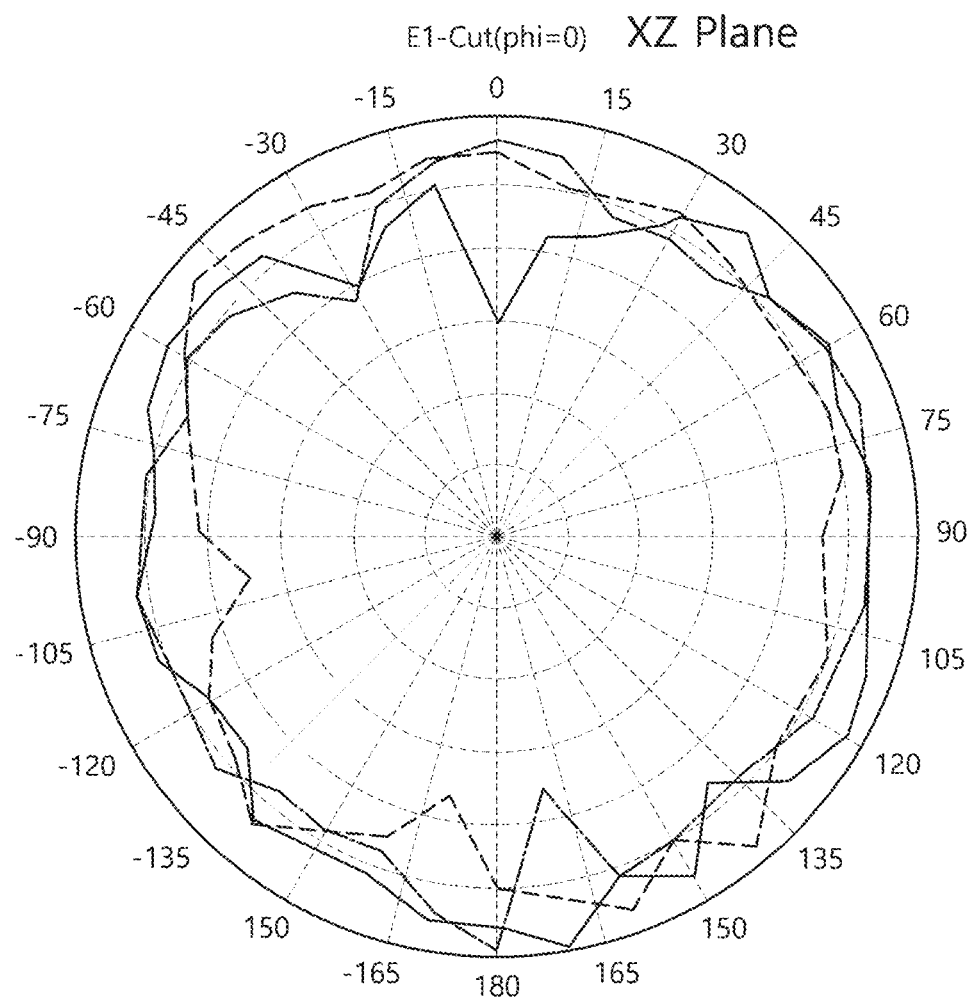
Figure 6C:
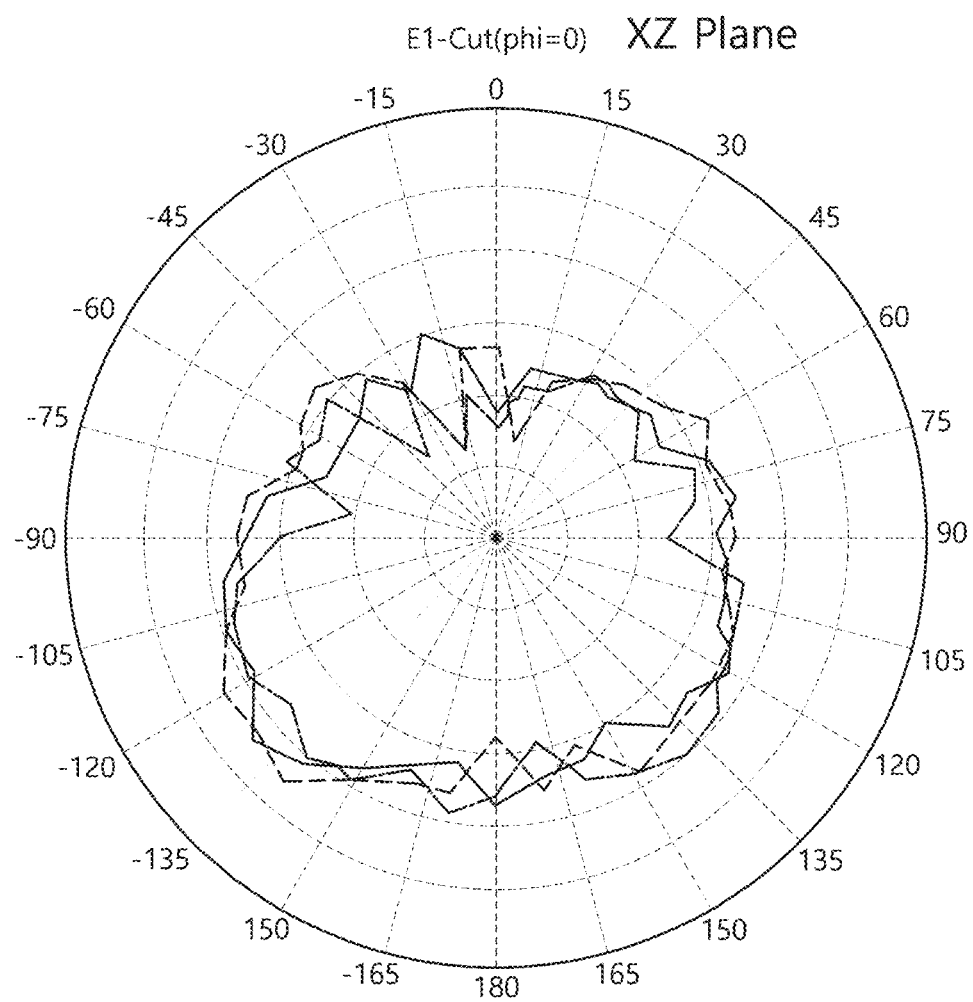

In addition, the influence of the heat dissipation plastic on the standing wave ratio (VSWR) and the radiation pattern of the 5G antenna was evaluated, and the evaluation results for the standing wave ratio (VSWR) are shown in FIGS. 5A to 5C, and the evaluation results for the radiation pattern are shown in FIGS. 6A to 6C.

As can be seen through FIGS. 5A to 5C, when comparing FIG. 5A (which is a graph of standing wave ratio (VSWR) in the default state before heat dissipation plastic is attached to the surface of the antenna for 5G) and FIG. 5B (which is a graph of standing wave ratio (VSWR) in a state in which the heat dissipation plastic according to Embodiment 1 is attached to the surface of the antenna for 5G), it can be seen that there is little influence of the heat dissipation plastic on the standing wave ratio since the graphs are well-matched. However, FIG. 5C, which is a graph of the standing wave ratio by the heat dissipation plastic according to Comparative Example 3, is significantly different from FIG. 5A, and through this, it can be seen that the heat dissipation plastic according to Comparative Example 3 is not suitable for use in a housing for repeater as it has a great influence on the signal repeating of the 5G repeater.

In addition, as can be seen through FIGS. 6A to 6C, when comparing FIG. 6A (which is a graph of an antenna radiation pattern in the default state before heat dissipation plastic is attached to the surface of the antenna for 5G) and FIG. 6B (which is a graph of a radiation pattern in a state in which the heat dissipation plastic according to Embodiment 1 is attached to the surface of the antenna for 5G), it can be seen that there is little change in the radiation pattern. However, FIG. 6C, which is a graph of a radiation pattern by the heat dissipation plastic according to Comparative Example 3, has a significantly reduced radiation pattern compared to FIG. 6A, and through this, it can be seen that the heat dissipation plastic according to Comparative Example 3 is not suitable for use in a housing for repeater as it significantly lowers the radiation characteristics of the 5G antenna.

TABLE 3

| | Embodiment 1 | Comparative Example 3 |
|---|---|---|
| Matrix forming component | polypropylene | PP |
| Heat dissipation filler (type/particle size (µm)/content (% by weight)) | BN/30/59 | Gr/75/59 |
| Relative permittivity (@28 GHz) | 3.5 | 100 |
| Thermal conductivity (W/mK) | 7.0 | 25 |

In Table 3, the heat dissipation plastic according to Comparative Example 3 has excellent thermal conductivity compared to the heat dissipation plastic according to Embodiment 1, but as can be seen in FIGS. 5A to 5C and FIGS. 6A to 6C, it is very inappropriate to be used, for example, in a housing for repeater for 5G using a high frequency band since its repeater signal transmission efficiency is not good.

Experimental Example 4

Figure 7A:
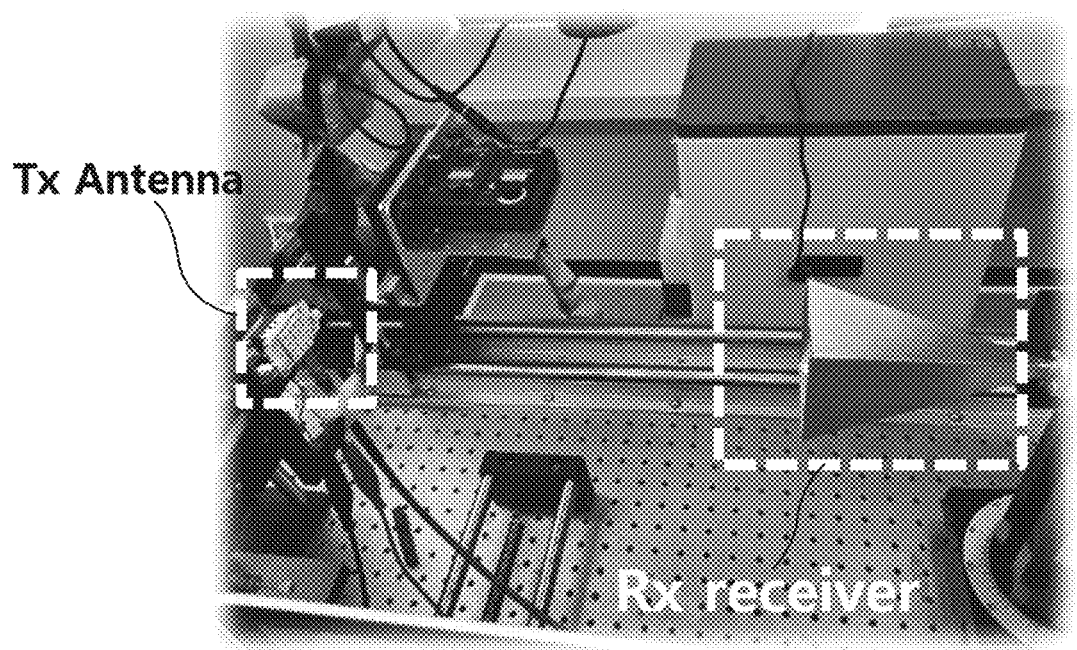
FIGS. 7A to 7C are photographs of a device used for evaluating the influence of a heat dissipation plastic on transmission efficiency of a transmission/reception signal of an antenna for 5G.
Figure 7B:
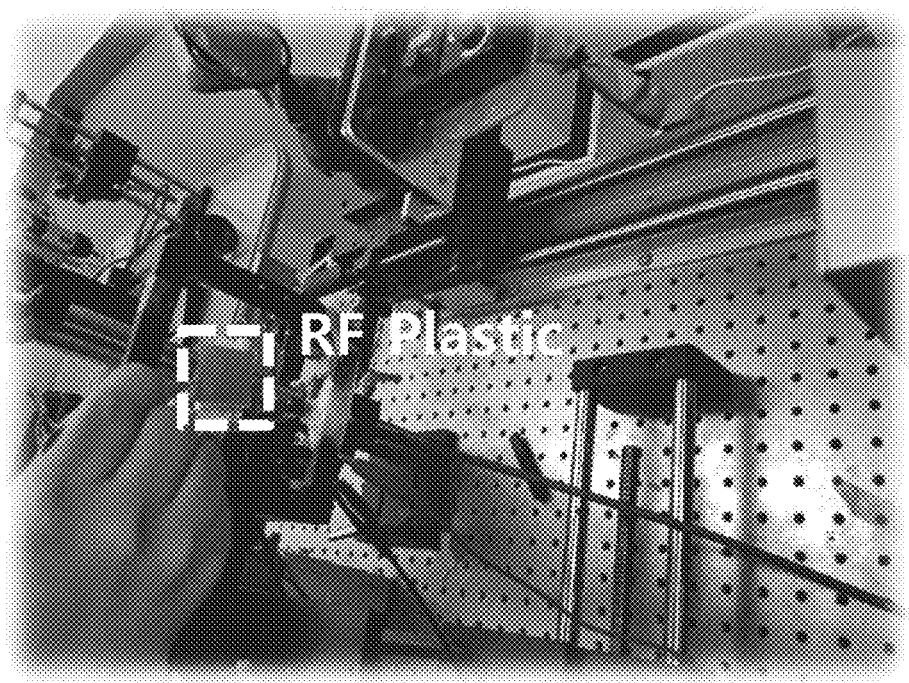
Figure 7C:
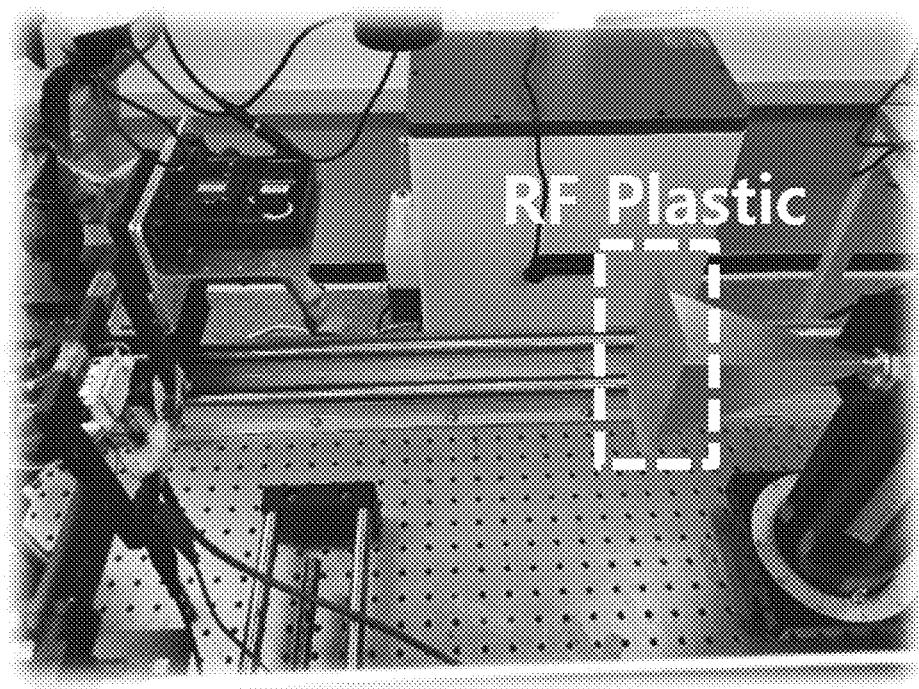

For the heat dissipation plastics according to Embodiment 3 and Comparative Example 2, S21 (dB), which is the signal transmission efficiency at 28 GHz, was measured, and specifically, S21 (dB), which is the signal transmission efficiency in the absence of the heat dissipation plastic as shown in FIG. 7A, was measured and defined as a default value, and then S21 (dB) was measured after attaching the heat dissipation plastics to the transmitting antenna (Tx) as shown in FIG. 7B and attaching the heat dissipation plastic to the receiving antenna (Rx) as shown in FIG. 7C, and the results are shown in Table 4.

TABLE 4

| | | Embodiment 3 | Comparative Example 1 |
|---|---|---|---|
| Matrix forming component | | polyphenylene ether/ polysulfone | PPU 30% by weight + glass fiber 10% by weight |
| Heat dissipation filler (type/particle size (µm)/content (% by weight)) | | BN/30/59 | BN/30/59 |
| Relative permittivity (@28 GHz) | | 3.7 | 8 |
| Thermal conductivity (W/mK) | | 7.0 | 6.7 |
| S21(dB) @28 GHz | Default | 18.59 | 18.59 |
| | Attached to Tx | 17.43 | 12.29 |
| | Attached to Rx | 18.43 | 11.25 |

As can be seen from Table 4, compared to Embodiment 3 having a relative permittivity of 4.0 or less, Comparative Example 1 has a large influence on the transmission/reception signal for 5G, so it can be seen that it is not suitable as a plastic for a housing for repeater.

Although exemplary embodiments of the present invention have been described above, the spirit of the present invention is not limited to the embodiments set forth herein. Those of ordinary skill in the art who understand the spirit of the present invention may easily propose other embodiments through supplement, change, removal, addition, etc. of elements within the same spirit, but the embodiments will be also within the scope of the present invention.

What is claimed is:

1. A housing for repeater having an accommodation part accommodating therein a device for repeating an RF signal, wherein at least a portion of the housing comprises a heat dissipation plastic having, at a frequency of 28 GHZ, a relative permittivity of less than or equal to 4 and a thermal conductivity of greater than or equal to 3 W/mK,
wherein the heat dissipation plastic comprises a matrix and a heat dissipation filler dispersed in the matrix, and
wherein the heat dissipation filler comprises a first heat dissipation filler having a particle size of 0.2 to 0.8 µm, a second heat dissipation filler having a particle size of 3 to 7 µm, and a third heat dissipation filler having a particle size of 25 to 50 µm, in a weight ratio of 1:1.7 to 3.0:9.0 to 11.0.

2. The housing for repeater of claim 1, wherein one side of the housing is open, and the heat dissipation plastic forms at least a portion of a cover member for opening and closing one side of the housing.

3. The housing for repeater of claim 1, wherein the heat dissipation plastic has a thickness of 0.5 to 10 mm.

4. The housing for repeater of claim 1, wherein the heat dissipation filler has a resistance of $1\times10^{14}\Omega$.

5. The housing for repeater of claim 1, wherein the heat dissipation filler has a plate-like shape.

6. The housing for repeater of claim 1, wherein the heat dissipation filler is provided in 50% by weight or more based on the total weight of the heat dissipation plastic.

7. The housing for repeater of claim 1, wherein the heat dissipation filler is surface-modified with one or more functional groups selected from the group consisting of a hydroxyl group, an alkyl group, an amine group and an aniline group.

8. The housing for repeater of claim 1, wherein the matrix comprises one or more selected from the group consisting of polyphenyl ether (PPE), polyphenyl ether/polystyrene alloy, polyphenyl ether/polypropylene alloy, polyphenyl ether/polyamide alloy, and liquid crystal polymer (LCP).

9. The housing for repeater of claim 1, wherein the heat dissipation filler comprises one or more of aluminum nitride, boron nitride, silicon nitride, and silicon carbide.

10. The housing for repeater of claim 1, wherein the heat dissipation filler comprises a heat dissipation filler having a core/shell structure comprising a thermally conductive core part and an insulating film covering the core part.

11. The housing for repeater of claim 10, wherein the thermally conductive core part is a carbon-based filler, and the insulating film is silicon oxide.

12. A repeater comprising:
   a housing for repeater according to claim 1; and
   a repeating part for repeating an RF signal, the repeating part being accommodated in the housing for repeater.

* * * * *